(12) United States Patent
Koinuma et al.

(10) Patent No.: US 6,617,539 B1
(45) Date of Patent: Sep. 9, 2003

(54) LASER HEATING APPARATUS

(75) Inventors: Hideomi Koinuma, Yokohama (JP); Masashi Kawasaki, Yokohama (JP)

(73) Assignee: Japan Science and Technology Kawaguchi, Tokyo (JP)

( * ) Notice: Subject to any disclaimer, the term of this patent is extended or adjusted under 35 U.S.C. 154(b) by 0 days.

(21) Appl. No.: 09/786,460

(22) PCT Filed: Sep. 10, 1999

(86) PCT No.: PCT/JP99/04948
§ 371 (c)(1),
(2), (4) Date: Mar. 5, 2001

(87) PCT Pub. No.: WO00/15864
PCT Pub. Date: Mar. 23, 2000

(30) Foreign Application Priority Data

Sep. 11, 1998 (JP) .......................................... 10/258973

(51) Int. Cl.[7] .............................................. B23K 26/00
(52) U.S. Cl. ................................................... 219/121.6
(58) Field of Search ....................... 219/121.6, 121.65, 219/121.66, 121.85, 121.86

(56) References Cited

U.S. PATENT DOCUMENTS

| 4,427,723 | A | * | 1/1984 | Swain ........................ 427/53.1 |
| 4,604,294 | A | * | 8/1986 | Tanaka et al. |
| 4,758,388 | A | * | 7/1988 | Hamada et al. |
| 5,159,169 | A | * | 10/1992 | Nishikawa et al. |
| 5,187,147 | A | * | 2/1993 | Ng et al. |
| 5,288,528 | A | * | 2/1994 | Blanchet-Fincher |
| 5,415,901 | A | * | 5/1995 | Tanaka et al. |
| 5,645,638 | A | * | 7/1997 | Kumagai et al. .............. 117/89 |

FOREIGN PATENT DOCUMENTS

| JP | 56-44770 | | 4/1981 | |
| JP | 2-213075 | | 8/1990 | |
| JP | 703022410 A | * | 1/1991 | .............. 219/121.6 |
| JP | 3-281074 | | 12/1991 | |
| JP | 404074859 A | * | 3/1992 | .............. 219/121.6 |
| JP | 405186218 A | * | 7/1993 | .............. 219/121.6 |
| JP | 8-311651 | | 11/1996 | |
| JP | 409236755 A | * | 9/1997 | |

OTHER PUBLICATIONS

H. Yokoyama, S. Kishida, *Research Material Prepared by Study Group on Quantum Device of Light, Electricity Society*, vol. OQD–85, No. 65–68 and 70, pp. 21–30)1985).

* cited by examiner

Primary Examiner—Samuel M. Heinrich
(74) Attorney, Agent, or Firm—Armstrong, Westerman & Hattori, LLP

(57) ABSTRACT

A laser heating apparatus (20) for heating a thin film forming substrate (1) in a thin film manufacturing process is disclosed. The substrate (1) set in position in a vacuum chamber (101) of a film forming apparatus (100) is irradiated with a laser light and is thereby heated to a desired temperature. The laser light is guided to a region of the substrate (1) by means of an optical fiber (23), and the laser beams emanating from the outlet end of the optical fiber (23) is incident directly or indirectly via a reflecting mirror (33) on the substrate (1). The optical fiber (23) is sheathed with a jacket tube (24) whose interior is vacuum drawn. Using a laser light enables the arrangement to be used even in an oxidizing atmosphere and even an insulating substrate to be heated.

5 Claims, 5 Drawing Sheets

LASER HEATING APPARATUS

TECHNICAL FIELD

This invention relates to a laser heating apparatus for heating a thin film forming substrate to an elevated temperature in a thin film manufacturing process.

FIELD OF THE INVENTION

In the case of forming a thin film on a semiconductor wafer and, inter alia, forming an oxide film on a substrate in a vacuum film forming apparatus designed to cause such a thin film to epitaxially grow, oxygen gas is introduced into a vacuum chamber of the film forming apparatus and is brought under a pressure of $10^{-2}$ to $10^{-4}$ Torr. Also by heating the substrate to an elevated temperature, adjustment is made of film forming conditions.

DESCRIPTION OF THE RELATED ART

To precisely position the substrate while heating it in such vacuum film forming apparatus in a manner as mentioned above, it has been the conventional practice that a small, electrically energizable heater is placed in a substrate setting area on a specimen precision mounting table (such as goniometer). Then, by energizing the heater with electric current to cause it to emit heat, the substrate is indirectly heated with heat so emitted.

As an alternative, a method has also been known that draws electric current directly through the substrate fixed on the specimen mounting table, thereby causing the substrate itself to emit heat.

In such conventional apparatus, however, especially of the type using the small heater, the maximum attainable heating temperature is limited up to as low as 800° C. Then, efficient heating cannot be achieved, and it is not necessarily easy to establish desired film forming conditions. In addition, there always exists the likelihood for the heater to burn off, making its use in an oxidizing atmosphere impossible. Also, the method of flowing current through the specimen substrate is only applicable to those substrates such as silicon substrates that can carry electric current, and must therefore have limited applicability.

Moreover, both of these methods or apparatus mentioned above requires heating by direct or indirect application of an electric current, which necessarily causes a magnetic field to build up. Such occurrence of a magnetic field gives rise to problems, when using an analysis that involves an analysis by using a low energy ion or electron beam, such as of affecting the precision of analysis by the magnetic field causing the traveling beam to deflect.

It is accordingly an object of the present invention to provide a laser heating apparatus that is capable of efficiently and properly heating a specimen substrate in a vacuum apparatus.

SUMMARY OF THE INVENTION

In order to achieve the object mentioned above, there is provided in accordance with the present invention, a laser heating apparatus for heating a thin film forming substrate, characterized in that a thin film forming substrate set in position on a substrate supporting mechanism in a vacuum chamber of a film forming apparatus is irradiated with a laser light so as to be heated to a predetermined temperature.

The apparatus mentioned above allows a substrate to be heated to and at a high temperature in an extremely short period of time. Further, using a laser light as means for heating the substrate permits the apparatus to be used even in an oxidizing atmosphere and also even an insulating substrate to be effectively heated. Also, freeing a heat source in a region of the substrate from current passage prevents generation of a magnetic noise and allows analysis using a low energy charged particle beam to be conducted properly.

The said substrate supporting mechanism can be a substrate supporting mechanism that is capable of positioning the said substrate in three orthogonal axial directions along an X-, a Y- and a Z-axis, and is also capable of so-called "U-centric" rotation. This specific arrangement being a mechanism that is capable of "U-centric" rotation has the advantage that tilting the substrate by the substrate supporting mechanism does not alter the conditions for irradiating the substrate with the laser light and does not alter the temperature of the substrate.

This specific arrangement permits only the substrate to be selectively heated.

Also, in a further preferred form of the laser heating apparatus according to the present invention, the said optical fiber is sheathed with a jacket tube whose interior is vacuum drawn or evacuated.

So constructed, the laser heating apparatus of the present invention can be used with a high vacuum apparatus.

Also, in a further preferred specific form of embodiment of the laser heating apparatus according to the present invention, the said optical fiber at an end thereof opposite to its outlet end is fastened to the said jacket tube by means of a fiber chuck and is fitted in a fitting bore of a flange and fastened thereto by means of a ferrule. So constructed, the laser heating apparatus according to the present invention can establish end-face coupling by coupling together the end face of the optical fiber leading from the laser generator placed outside of the vacuum chamber and the end face of the optical fiber located inside the vacuum chamber by connector, and thus permits introducing the laser light into the vacuum chamber without materially affecting a vacuum attained therein.

Further, in another preferred form of the laser heating apparatus according to the present invention, the laser light from the outlet end of the said optical fiber is radiated via a reflecting mirror onto the substrate.

This specific arrangement permits the position of irradiation with the laser beam to be altered.

Also, in another preferred form of embodiment of the laser heating apparatus according to the present invention, the laser light is a Nd:YAG laser light.

This specific arrangement allows the substrate to be heated to and at a high temperature in an extremely short period of time.

Further, in another specific form of embodiment of the laser heating apparatus, there is included a substrate holder for holding a substrate, the substrate holder having slit orifices formed so as to surround the substrate supported thereby.

This specific arrangement permits the substrate to be heated efficiently by preventing diffusion of heat and increasing temperature uniformity.

Also, in another preferred specific form of embodiment of the laser heating apparatus according to the present invention, there is included a substrate holder for holding a substrate, the substrate holder having an area on which the laser light is incident, and which area is composed of a material that is high in laser light absorbing power.

This specific arrangement permits the substrate to efficiently absorb the laser light.

Further, in another preferred specific form of embodiment of the laser heating apparatus according to the present invention, there is included a substrate holder for holding the substrate, the substrate holder having an area on which said laser light is incident, and which area is coated with a material that is a metal oxide or ceramic.

This specific arrangement makes the substrate holder light in weight and yet causes it to absorb the laser light efficiently to heat the substrate.

Also, in another preferred specific form of embodiment of the laser heating apparatus according to the present invention, there is included a substrate holder for holding the substrate, the substrate holder having an area on which the laser light is incident, and which area is formed with a thin film that is composed of a material that is high in laser light absorptivity.

This specific arrangement makes the substrate holder light in weight and yet causes it to absorb the laser light efficiently to heat the substrate.

Further, in yet another specific form of embodiment of the laser heating apparatus according to the present invention, the said coating or thin film material so that it may not be vaporized is protected by a transparent material.

This specific arrangement prevents the material that absorbs the laser light from depletion or degradation.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof.

DETAILED DESCRIPTION OF THE PREFERRED EMBODIMENTS

Figure 1:
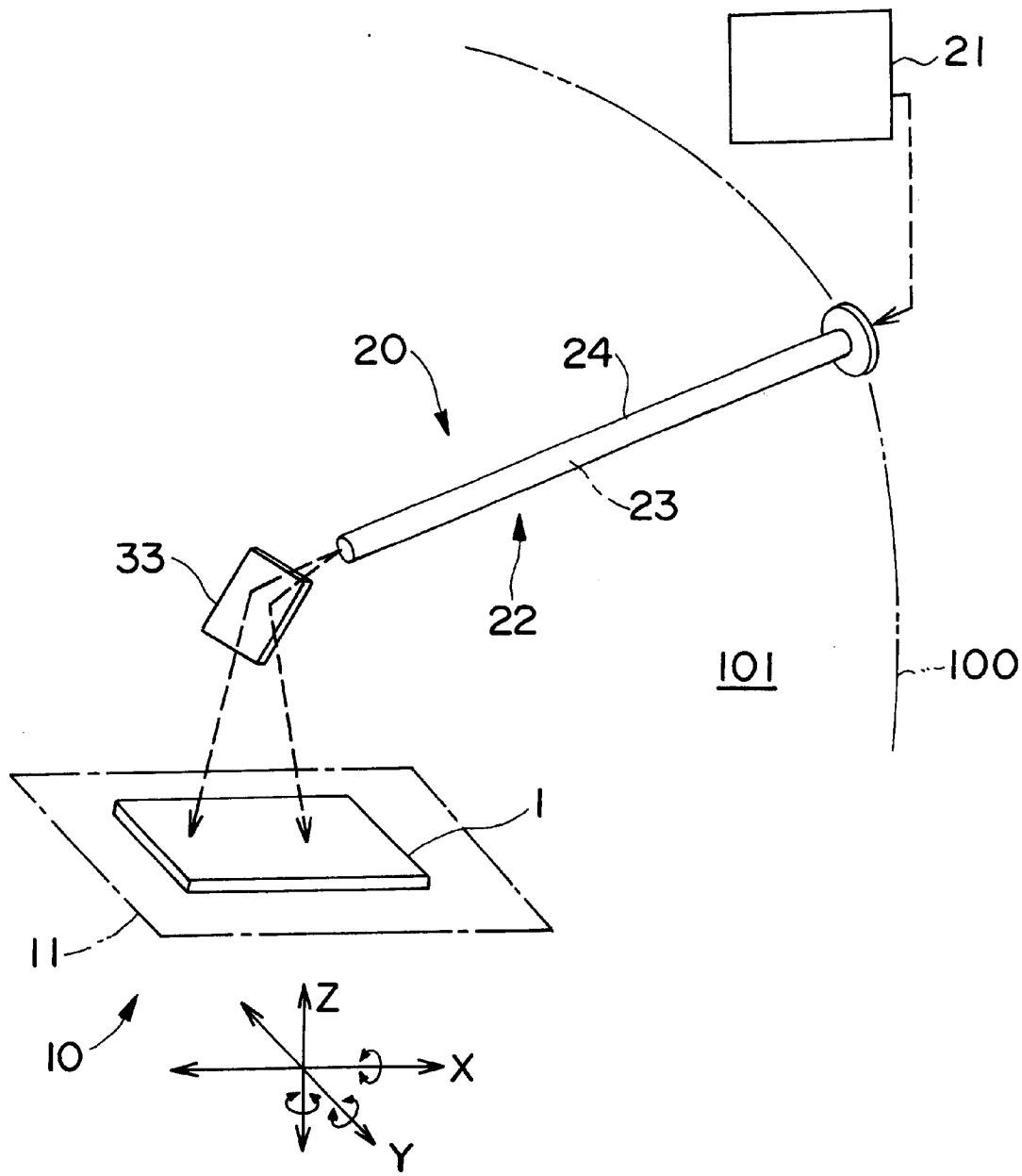
FIG. 1 is a perspective view diagrammatically illustrating the make-up of a certain form of embodiment of the laser heating apparatus according to the present invention.

Hereinafter, the present invention will be described in detail with reference to suitable embodiments thereof illustrated in the drawing figures. While the present invention will hereinafter been set forth with respect to certain illustrative embodiments thereof, it will readily be appreciated to be obvious to a person skilled in the art that many alternations thereof, omissions therefrom and additions thereto can be made without departing from the essences of scope of the present invention. Accordingly, it should be understood that the invention is not intended to be limited to the specific embodiments thereof set forth below, but to include all possible forms of embodiment thereof that can be made within the scope with respect to the features specifically set forth in the appended claims and encompasses all the equivalents thereof.

A detailed description will first be given in respect of a typical form of embodiment of the laser heating arrangement according to the present invention with reference to the drawing figures.

In this form of embodiment, as illustrated in FIG. 1 a substrate 1 is supported at a preselected location by a substrate supporting mechanism 10, for example in a vacuum chamber 101 of a vacuum film forming apparatus 100. Included in the vacuum film forming apparatus 100 is a laser heater or heating arrangement 20 according to the present invention for high-temperature heating the substrate 1. Also included in the vacuum film forming apparatus is a reactive gas control mechanism (not shown) for introducing an oxygen gas into the vacuum chamber 101 and setting and regulating a gaseous pressure thereof at a preselected level.

According to the present invention, the substrate 1 set in position in the vacuum chamber 101 of the vacuum film forming apparatus is designed to be irradiated with a laser light so that the substrate 1 is heated to a predetermined temperature.

More specifically, the laser heating arrangement 20 includes a laser generator 21, and a laser light guidance and radiating means 22 that incorporates an optical fiber to be described below. A laser light produced by the laser generator 21 is guided by means of the optical fiber to a region of the substrate 21, and the laser light from the outlet end of the optical fiber is radiated directly or indirectly onto the substrate 1. In this form of embodiment illustrated, for the laser generator 21 use is made of a ND: YAG laser generator and for the laser light use is made of a laser light produced thereby.

Figure 2:
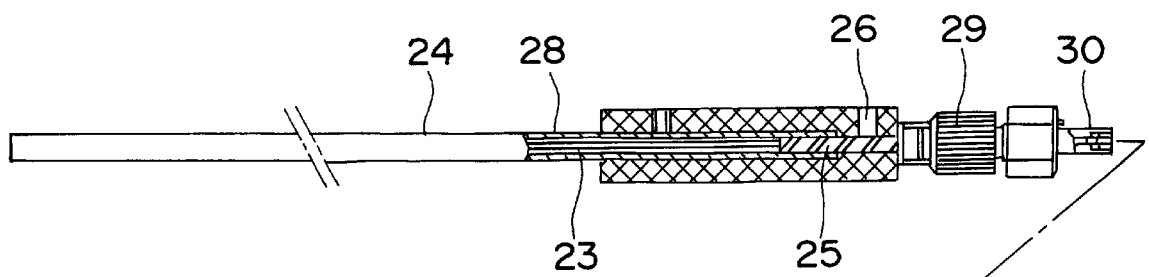
FIG. 2 is a cross sectional view illustrating the make-up of an exemplary laser light guidance and radiating means for use in a laser heating arrangement of the present invention.
Figure 2:
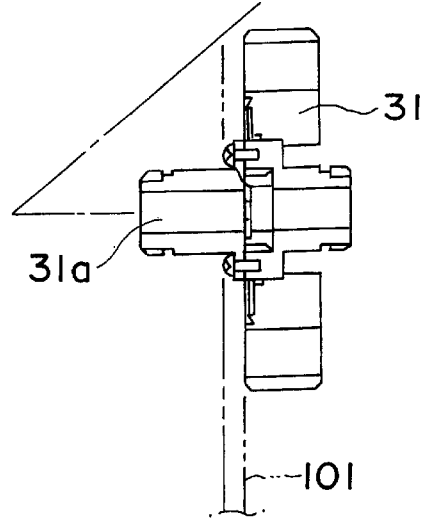

Here in the laser light guidance and radiating means 22, as shown in FIG. 2 the optical fiber 23 is advantageously sheathed with a jacket tube 24, advantageously made of stainless steel, whose interior is designed to be vacuum drawn or evacuated. In this case, an outer covering 25 that covers both the optical fiber 23 and the jacket tube 24 is formed with a vacuum drawing orifice 26 near or towards the inlet end of the optical fiber 23. Vacuum drawing orifices 27 (see FIG. 3) and 28 are also formed in the jacket tube 24 at suitable areas thereof over the optical fiber 23 towards its outlet end. The interior of the jacket tube 24 is thus vacuum drawn through these orifices 26, 27 and 28.

The inlet end of the optical fiber 23 is clamped by a fiber chuck 29, and a tube ferrule 30 is fitted in a fitting bore 31a of a flange 31. The flange 31 is fastened in position to the vacuum chamber 101 by means of a bolt or the like. The laser light from the laser generator 21 is introduced into the inlet end of the optical fiber 23 so attached to and assembled with the vacuum chamber 101.

Figure 3:
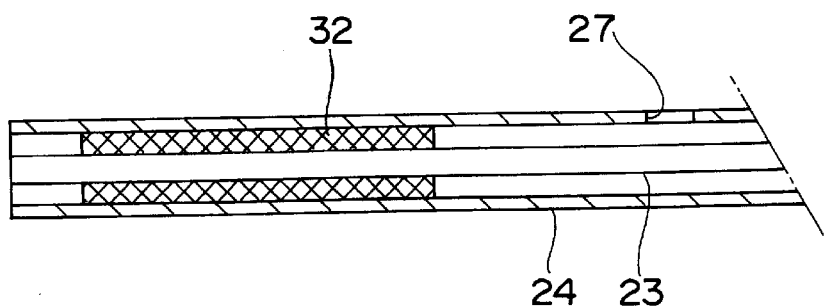
FIG. 3 is a cross sectional view illustrating a region of the forward end of the laser light guidance and radiating means of the present invention.

Also, the jacket tube 24 at the outlet end side of the optical fiber 23 as shown in FIG. 3 is filled with a ceramic or glass base adhesive 32 around the optical fiber 23. The outlet end of the optical fiber 23 is shaped with a curved surface such that the laser light projecting therefrom may impinge with an appropriate spot diameter on the substrate 1.

Further, in the form of embodiment illustrated, the laser light outgoing from the outlet end of the optical fiber 23 as shown in FIG. 1 passes through a reflecting mirror 33 and then impinges on the substrate 1. It should be noted, however, that the substrate 1 might be irradiated directly with the laser light from the outlet end of the optical fiber 23 without using the reflecting mirror 33.

The substrate 1 is supported on a substrate holder 11 of the substrate supporting mechanism 10. According to such substrate supporting mechanism 10, the substrate 1 can be positioned, by means of the substrate holder 11, in three orthogonal axial directions along an X-, a Y- and a Z-axis. In this case, the substrate can also be rotationally positioned about each of the three orthogonal axes, and possibly also so-called "U-centrically". This permits the substrate 1 to be positioned with extremely high positioning accuracy.

According to a laser heating arrangement 20 of the present invention so constructed as mentioned above, a laser light produced at the laser generator 21 is guided through the optical fiber 23 to a region of the substrate 1, and in the form of embodiment illustrated, indirectly through the reflecting mirror 33 to a region of the substrate 1 for impingement thereon. This substrate heating process, especially using a Nd:YAG laser light, permits a substrate 1 to be heated to and at an elevated temperature in an extremely short period of time.

Also, using a laser light allows this heating arrangement to be employed in an oxidizing atmosphere in the vacuum chamber 101, and permits even an electrically insulating substrate to be effectively heated by this arrangement that is not designed to pass electric current therethrough. Further, freeing a heat source in a region of the substrate from current passage prevents generation of any magnetic noise and allows analysis to be conducted properly using a low energy charged particle beam or the like. At the same time, a precision specimen table is brought to realization that is excellent in performance characteristics in which the substrate 1 can be accurately positioned as required by the substrate supporting mechanism 10.

The above being the case, permitting the interior of the jacket tube 24 sheathing the optical fiber 23 to be adjustably vacuum drawn, coupled with the elaborated way of introducing the laser light into the vacuum chamber 101, provides the ability for the atmospheric pressure to be controllable variably from an extremely high vacuum to an atmospheric pressure.

Mention is next made of a substrate holder.

In order to well absorb a ND:YAG laser light of wavelength $\lambda=1.06$ $\mu$m, it is desirable that the substrate holder be a metal plate composed of a material having good thermal conductivity such as inconel, nickel or chrome and oxidized at a high temperature.

Figure 4A:
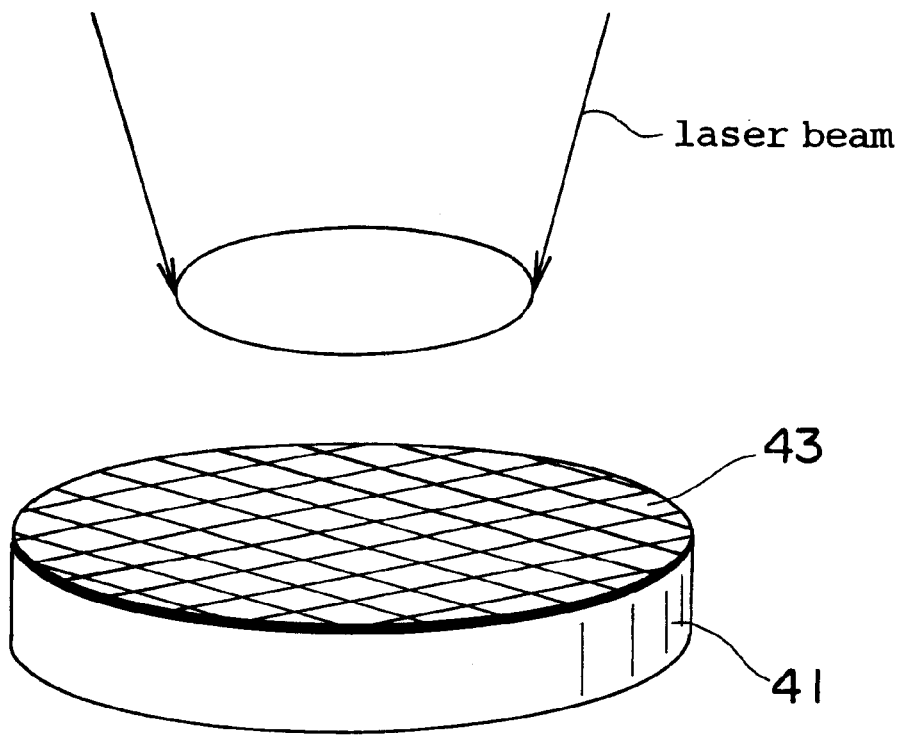
FIGS. 4A and 4B show one form of embodiment of the substrate holder according to the present invention in a perspective view of appearance and in a cross sectional view, respectively.
Figure 4B:
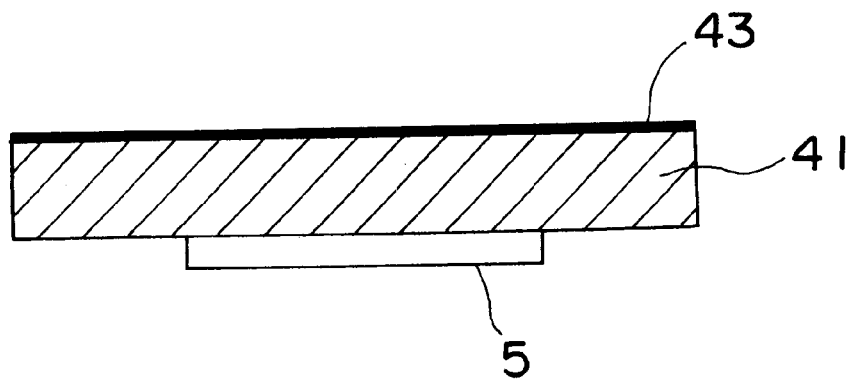

FIGS. 4A and 4B show a substrate holder in perspective view of appearance and cross sectional view, respectively. In FIG. 4A, the side irradiated with a laser light is shown.

A substrate holder 41 shown in FIGS. 4A and 4B is formed on its side irradiated with the laser light, with a layer of a material such as a metal oxide or ceramic that well absorbs the laser light. The layer of such material that is high in athermanous or heat absorbing efficiency may be provided by coating. While the substrate holder is shown in the form of a disk in FIGS. 4A and 4B, it should be noted that the holder may be of any other, preferably symmetrical shape.

Figure 5A:
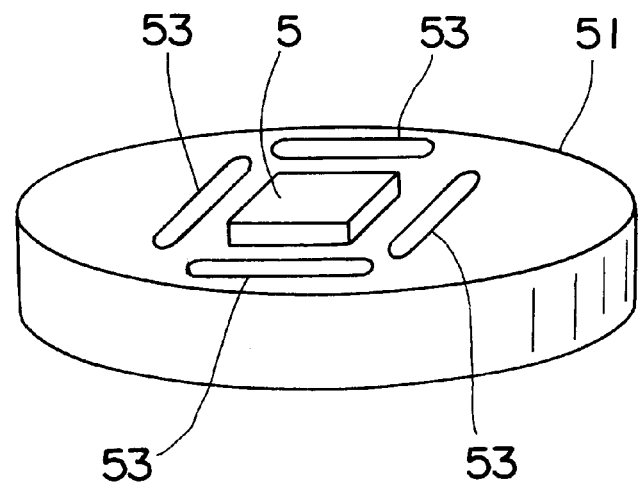
FIGS. 5A and 5B show a substrate holder formed with slit orifices in a perspective view of appearance and a cross sectional view, respectively.
Figure 5B:
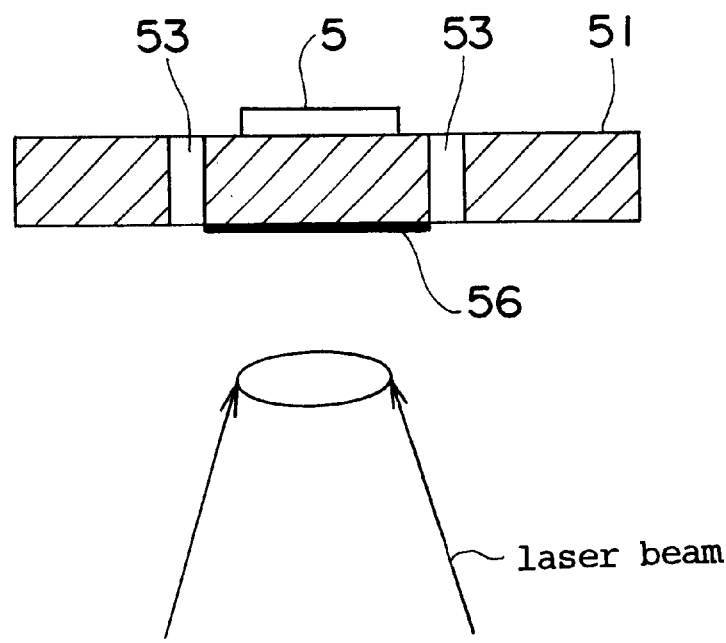

A substrate holder 51 shown in FIGS. 5A and 5B has slit orifices 53 so formed as to surround a substrate shown in FIG. 4 and also has a metal oxide layer 56 formed on a portion thereof by oxidizing the portion at a high temperature. Both the orifices and the metal oxide are designed to efficiently heat the substrate.

A substrate holder formed with slit orifices to surround the substrate may be of a material that is poor in thermal conductivity. While in FIGS. 5A and 5B a single substrate is shown, a plurality of substrates may be surrounded by slit orifices. In this case, the slit orifices may be formed so as to surround either each of or more than one substrates.

Such substrate holders provided with slit orifices prevent escape of a quantity of heat applied to heat the substrate and allows the substrate to be heated efficiently and increases temperature uniformity.

Also, in order to well absorb a Nd:YAG laser light, a metal foil of oxidized inconel, nickel or chrome may be utilized.

Figure 6A:
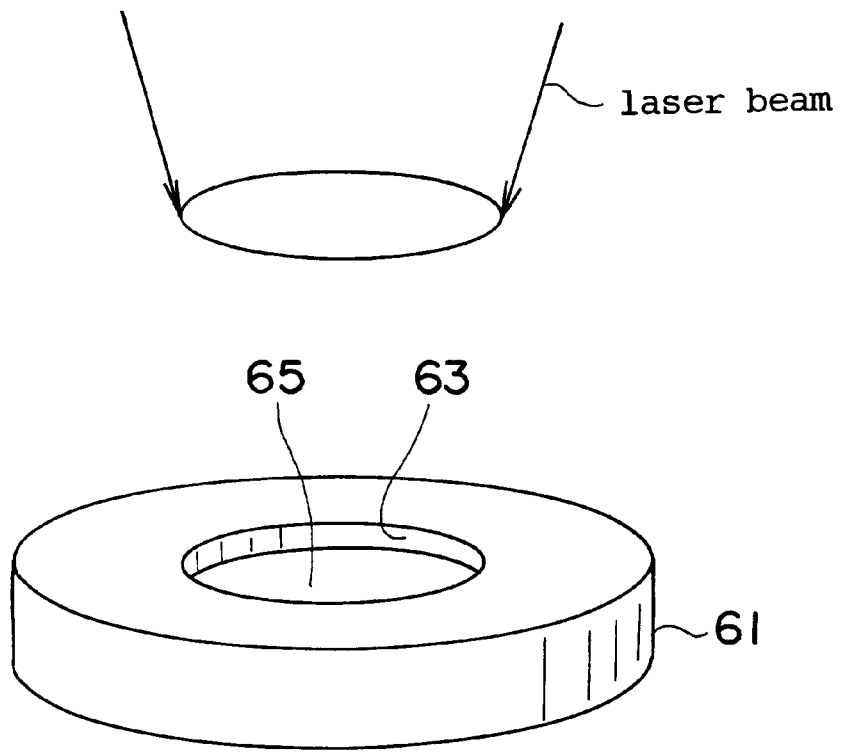
FIGS. 6A and 6B show another form of embodiment of the substrate holder in a perspective view of appearance and in a cross sectional view, respectively.
Figure 6B:
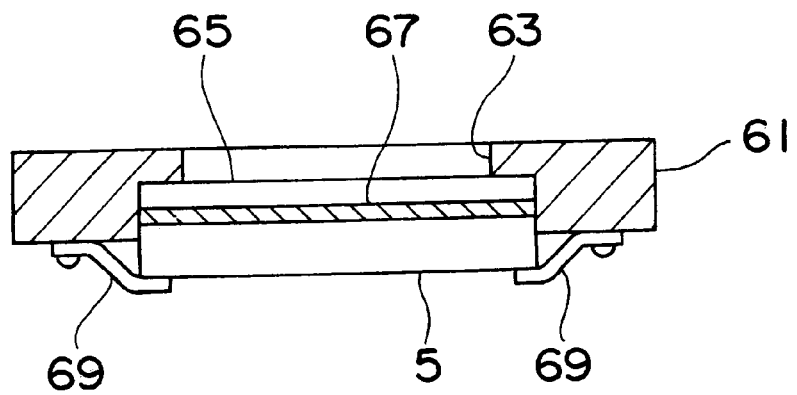

FIGS. 6A and 6B show a substrate holder of an alternative form in perspective view of appearance and cross sectional view, respectively. In FIG. 6A, the side is shown that is irradiated with a laser light.

Referring to FIGS. 6A and 6B, the alternative substrate holder 61 has a bore 63 formed with a stepped portion in which a sapphire (disk) 65 is placed in contact therewith. Then, a metal foil 67, for example, of inconel oxidized at a high temperature is sandwiched between the sapphire 65 and a substrate 5, and a fixture 69 is used to fasten the substrate 5 to the substrate holder 61. While in this form of embodiment the sapphire 65 is used to enclose the light accepting surface of the metal foil so it may not be vaporized by the laser light, it may be of any other transparent material that can withstand heating by the laser light.

A substrate holder so constructed as mentioned is light in weight, can well absorb a laser light and reduces to minimum the amount of heat escaping from the heated metal foil.

Such a substrate holder therefore permits a substrate to be efficiently heated and increases temperature uniformity.

In the forms of embodiment described, the laser medium is not limited to a solid state laser such a Nd:YAG laser but may be liquid, gas or semiconductor laser.

As has been set forth in the foregoing description, a laser heating apparatus according to the present invention is provided in which for heating a substrate in a vacuum chamber, use is made of a laser light. A heating apparatus is therefore provided that can be used in an oxidizing atmosphere and that can be employed to effectively heat even an insulating substrate.

A heating apparatus is accordingly provided that has an extended range of applications, that is free from creating a magnetic noise and that ensures accurate analysis results.

A laser heating apparatus of the present invention is accordingly highly useful as means for heating a specimen both efficiently and properly.

What is claimed is:

1. A laser heating apparatus for heating thin film forming substrates, wherein a thin film forming substrate set in place on a substrate supporting mechanism in a vacuum chamber of a film forming apparatus is irradiated with a laser light so as to be heated to a predetermined temperature, and wherein the laser light is guided by means of an optical fiber to a region of said substrate, and said substrate is irradiated directly or indirectly with the laser light arriving from an outlet end of said optical fiber.

2. A laser heating apparatus as set forth in claim 1, wherein said optical fiber is sheathed with a jacket tube whose interior is vacuum drawn.

3. A laser heating apparatus as set forth in claim 1 or claim 2, wherein said optical fiber at an end thereof opposite to its outlet end is fastened to said jacket tube by means of a fiber chuck and is fitted in a fitting bore of a flange and fastened thereto by means of a ferrule.

4. A laser heating apparatus as set forth in claim 1, wherein the laser light from the outlet end of said optical fiber is radiated via a reflecting mirror onto said substrate.

5. A laser heating apparatus as set forth in claim 1, wherein said laser light is a Nd:YAG laser light.

* * * * *